United States Patent
Kim et al.

[11] Patent Number: 6,088,277
[45] Date of Patent: Jul. 11, 2000

[54] READ ONLY MEMORY CAPABLE OF REALIZING A HIGH-SPEED READ OPERATION

[75] Inventors: Kang-Young Kim; Byeng-Sun Choi, both of Suwon, Rep. of Korea

[73] Assignee: Samsung Electronics, Co., Ltd., Suwon, Rep. of Korea

[21] Appl. No.: 09/340,556

[22] Filed: Jun. 28, 1999

[30]       Foreign Application Priority Data

Jun. 29, 1998 [KR]   Rep. of Korea ...................... 98-25171

[51] Int. Cl.⁷ ...................................................... G11C 7/00
[52] U.S. Cl. ...................... 365/207; 365/104; 365/189.09
[58] Field of Search .............................. 365/207, 94, 104, 365/189.09, 206, 230.06

[56]                  References Cited

U.S. PATENT DOCUMENTS 5,625,586   4/1997   Yamasaki et al. ....................... 365/104
5,793,666   8/1998   Yamazaki ................................. 365/104

*Primary Examiner*—Tan T. Nguyen
*Attorney, Agent, or Firm*—Marger Johnson & McCollom, P.C.

[57]                     ABSTRACT

A read-only memory device having a NOR structure is provided. The memory device comprises a memory cell array having a plurality of memory cells, each memory cell storing data, a plurality of first bit lines coupled to the array, and a plurality of second bit lines coupled to the array. A first selection circuit are coupled to the plurality of first bit lines for selecting at least two adjacent first bit lines. A second selection circuit coupled to the plurality of second bit lines for selecting at least two adjacent second bit lines. A sense amplification circuit detect a cell state of a selected memory cell by biasing the selected first bit lines and one of the selected second bit lines with a same potential. The second selection circuit grounds another of the selected second bit lines. The first selection circuit grounds unselected first bit lines and wherein the second selection circuit grounds unselected second bit lines. According to the mask ROM of the present invention, leakage current paths to the biased main and ground bit lines are cut off during a data reading operation of an off-cell. The biased main and ground bit lines can be charged by only one sense amplification circuit.

24 Claims, 6 Drawing Sheets

READ ONLY MEMORY CAPABLE OF REALIZING A HIGH-SPEED READ OPERATION

FIELD OF THE INVENTION

The present invention relates to a semiconductor memory device and, more particularly, to a mask read-only memory having a NOR structure.

BACKGROUND OF THE INVENTION

FIG. 1 is a diagram showing a conventional memory cell array of a NOR-structured mask ROM (often referred to as flat-type mask ROM). Referring to FIG. 1, a first plurality of memory cells, e.g., Mm1 ... Mm10, is connected in parallel to a second plurality of memory cells, e.g., M11 ... M20. Each memory cell of the first and second plurality of memory cells is coupled to two adjacent sub bit lines constituting a bank also referred to as a group, a string, etc. The memory cells of each bank are connected to corresponding word lines. For example, the memory cells M11 and Mm1 are connected in parallel between sub bit lines SBL1 and SBL2. The memory cells M11 to Mm1 are also connected to corresponding word lines WL1 to WLm. Each memory cell is composed of a metal-oxide-semiconductor field effect transistor (MOSFET) having a source, a drain and a gate.

In FIG. 1, an even-numbered sub bit line SBL2 is connected to a main bit line MBL1 through an NMOS transistor BST1 (acting as a bank selector). The NMOS transistor BST1 is turned on/off by a select signal SSL1. An even-numbered sub bit line SBL4 is connected to the main bit line MBL1 through an NMOS transistor BST2 (acting as a bank selector). The NMOS transistor BST2 is turned on/off by a select signal SSL2. Other even-numbered sub bit lines SBL6, SBL8, etc., are likewise connected to corresponding main bit lines MBL3, MBL4, etc., through corresponding NMOS bank select transistors BST3, BST4, etc.

An odd-numbered sub bit line SBL1 is connected to a ground bit line GBL1 through an NMOS transistor GST1 (acting as a ground selector). NMOS transistor GST1 is turned on/off by a select signal GSL1. An odd-numbered sub bit line SBL3 is connected to the ground bit line GBL1 through an NMOS transistor GST2 (acting as a ground selector). NMOS transistor GST2 is turned on/off by a select signal GSL2. Other odd-numbered sub bit lines SBL5, SBL7, etc., are likewise connected to corresponding ground bit lines GBL3, GBL4, etc., through ground select transistors GST3, GST4, etc.

The data reading operation of the NOR-structured mask ROM shown in FIG. 1 is as follows. To select a memory cell M11, the select signal SSL1, ground select signal GSL1, and one word line WL1 are activated and the select signal SSL2 and ground select signal GSL2 are deactivated. A main bit line MBL2 adjacent to a selected main bit line MBL1 and a ground bit line GBL1 are grounded. At the same time, the selected main bit line MBL1 is supplied with a sense current Isen through a column pass gate circuit (not shown). The sense current Isen is, in turn, supplied by a prior art sense amplifier 2 shown in FIG. 2. The sense amplifier 2 is disclosed in U. S. Pat. No. 5,856,748, entitled SENSE AMPLIFIER WITH CURRENT MIRROR, incorporated herein by reference.

If the selected memory cell M11 is turned on at the activation of the word line coupled thereto (referred to as an "on-cell"), current supplied to the selected main bit line MBL1 is discharged through a discharge path L1 illustrated by the dotted line. The discharge path L1 comprises the NMOS transistor BST1, the selected memory cell M11, the sub bit line SBL1, the NMOS transistor GST1, and the ground bit line GBL1. Alternatively, if the selected memory cell M11 is turned off at the activation of the word line coupled thereto (referred to as an "off-cell"), the potential of the selected main bit line MBL1 increases because no discharge path L1 is formed. As this happens, the potential of the selected main bit line MBL1 is sensed and amplified by means of the sense amplifier 2. Thus, the memory cells M11, M12, M13, etc., collectively connected to the selected word line WL1 are simultaneously turned on. Leakage current paths to a ground bit line GBL2 and into a main bit line MBL2 may be formed owing to a source-drain voltage difference Vds of memory cells (MOSFETs) commonly connected to the selected word line WL1. The leakage current path is shown as dotted line L2. In particular, when the selected memory cell M11 is an offcell, the leakage current path L2 causes an increased sensing time thereby preventing realization of a high speed mask ROM. Furthermore, in the worst case, even though it is an off-cell, the selected memory cell M11 may be discriminated as the on-cell because the potential of the selected main bit line MBL1 drops owing to the leakage current path L2. Therefore, preventing the formation of the leakage current paths is required to embody a high-speed mask ROM having the NOR structure. One approach for preventing formation of leakage current paths is to make the main bit lines positioned at the right side of a selected main bit line have the same potential as the selected main bit line. The main bit lines having the same potential as the selected main bit line MBL1 are often termed "bias main bit lines". According to the aforementioned approach, no source-drain voltage difference Vds of each memory cell (MOSFET) coupled in common to the selected word line is made. Therefore, the leakage current path L2 is cut off.

The more main bit lines set at the same potential as a selected main bit line, the less current is leaked. The penalty, however, is an increased power consumption and an increased charge/discharge time for charging and discharging a selected main bit line and bias main bit lines. The increased charge/discharge time increases the sensing time thereby preventing realization of a high-speed mask ROM. It also is impossible for only one sense amplifier 2 (FIG. 2) to bias all of the bias main bit lines generating power noise when the bias main bit lines are discharged.

SUMMARY OF THE INVENTION

It is an object of the present invention to overcome the disadvantages associated with prior art read only memory devices.

It is another object of the present invention to provide a NOR-structured mask read-only memory device capable of realizing a high-speed data reading operation.

It is yet another object of the invention to provide a NOR-structured mask read-only memory device capable of preventing formation of leakage current paths during a data reading operation of an off-cell.

A read-only memory device having a NOR structure is provided. The memory device comprises a memory cell array having a plurality of memory cells, each memory cell storing data, a plurality of first bit lines coupled to the array, and a plurality of second bit lines coupled to the array. First selection means are coupled to the plurality of first bit lines for selecting at least two adjacent first bit lines. Second selection means are coupled to the plurality of second bit lines for selecting at least two adjacent second bit lines. Sense amplification means detect a cell state of a selected memory cell by biasing the selected first bit lines and one of the selected second bit lines with a same potential. The second selection means grounds another of the selected second bit lines. The first selection means grounds unselected first bit lines and wherein the second selection means grounds unselected second bit lines.

The plurality of first bit lines are be divided into a plurality of bit line groups. The first selection means comprises a first decoding circuit for generating a plurality of first and second selection signals, a first column pass gate circuit for selecting a group of first bit lines responsive to a first selection signal, and a second column pass gate circuit for providing a sensing current to a selected first bit line and a bias current to another selected first bit line.

The first column pass gate circuit comprises a plurality of first switching sections, each first switching section is coupled to a corresponding first selection signal and a first bit line. Each first switching section is a NMOS transistor having a current path formed between the corresponding first bit line and the second column pass gate circuit and a gate for receiving the corresponding first selection signal.

The second selection signals are divided into sensing current selection signals, bias current selection signals, and ground selection signals and wherein the second column pass gate circuit comprises a plurality of second switching sections, each second switching section comprising a plurality of transistors.

Each second switching section comprises a plurality of NMOS transistors responsive to a sensing current selection signal, bias current selection signal, and a ground selection signal. Each second switching section comprises a first, a second, and a third NMOS transistors, the first NMOS transistor having a gate for receiving a corresponding sensing current selection signal and a current path formed between a corresponding first switching section and a first node for receiving a sensing current, the second NMOS transistor having a gate for receiving a corresponding bias current selection signal and a current path formed between a corresponding first switching section and a second node for receiving a bias current, and the third NMOS transistor having a gate for receiving a corresponding ground selection signal and a current path formed between a corresponding first switching section and a ground.

The sense amplification means comprises a bias voltage generating circuit for generating a bias voltage and a reference current sourcing section having a reference node for sourcing a reference current in accordance with the bias voltage. A sense current sourcing circuit has a sense node for sourcing the sensing current in accordance with the bias voltage. A bias current sourcing circuit sources the bias current in accordance with the bias voltage and a differential amplifier for comparing a voltage difference between the reference and sense nodes.

The plurality of second bit lines are divided into a plurality of second bit line groups, each second bit line corresponding to a first bit line. The second selection means comprises a second decoding circuit for generating a plurality of third and fourth selection signals, a third column pass gate circuit for selecting a group of second bit lines responsive to a third selection signal, and a fourth column pass gate circuit for providing the bias current to a selected second bit line and grounding all other selected second bit lines. The third column pass gate circuit comprises a plurality of third switching sections, each third switching section is coupled to a corresponding third selection signal and a second bit line. Each third switching section is a NMOS transistor having a current path formed between the corresponding second bit line and the fourth column pass gate circuit and a gate for receiving the corresponding third selection signal.

BRIEF DESCRIPTION OF THE DRAWINGS

The foregoing and other objects, features, and advantages of the invention will become more readily apparent from the following detailed description of a preferred embodiment that proceeds with reference to the following drawings.

DESCRIPTION OF THE PREFERRED EMBODIMENT

Figure 1:
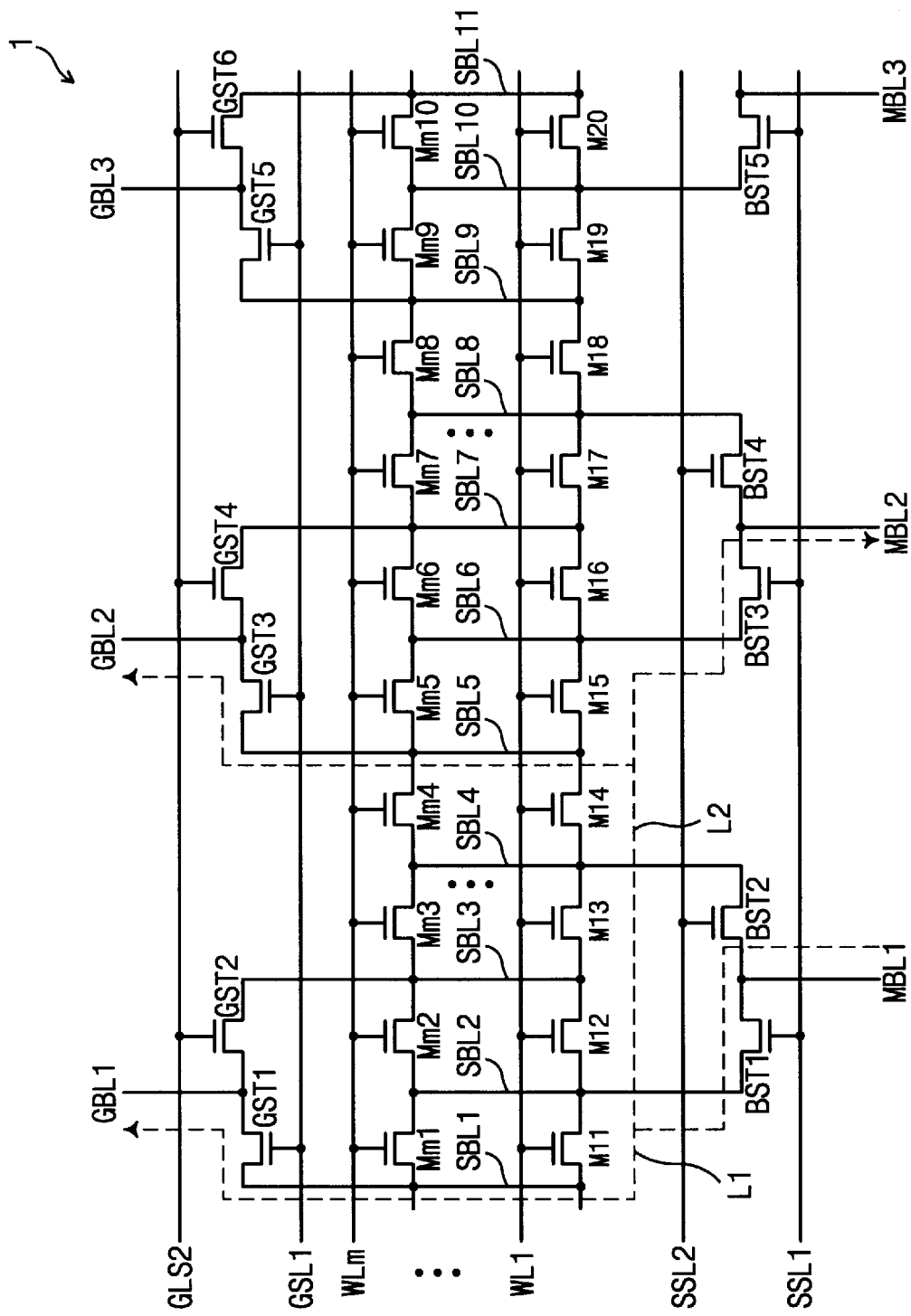
FIG. 1 is a schematic diagram of a conventional cell array for a mask ROM having a NOR structure.
Figure 2:
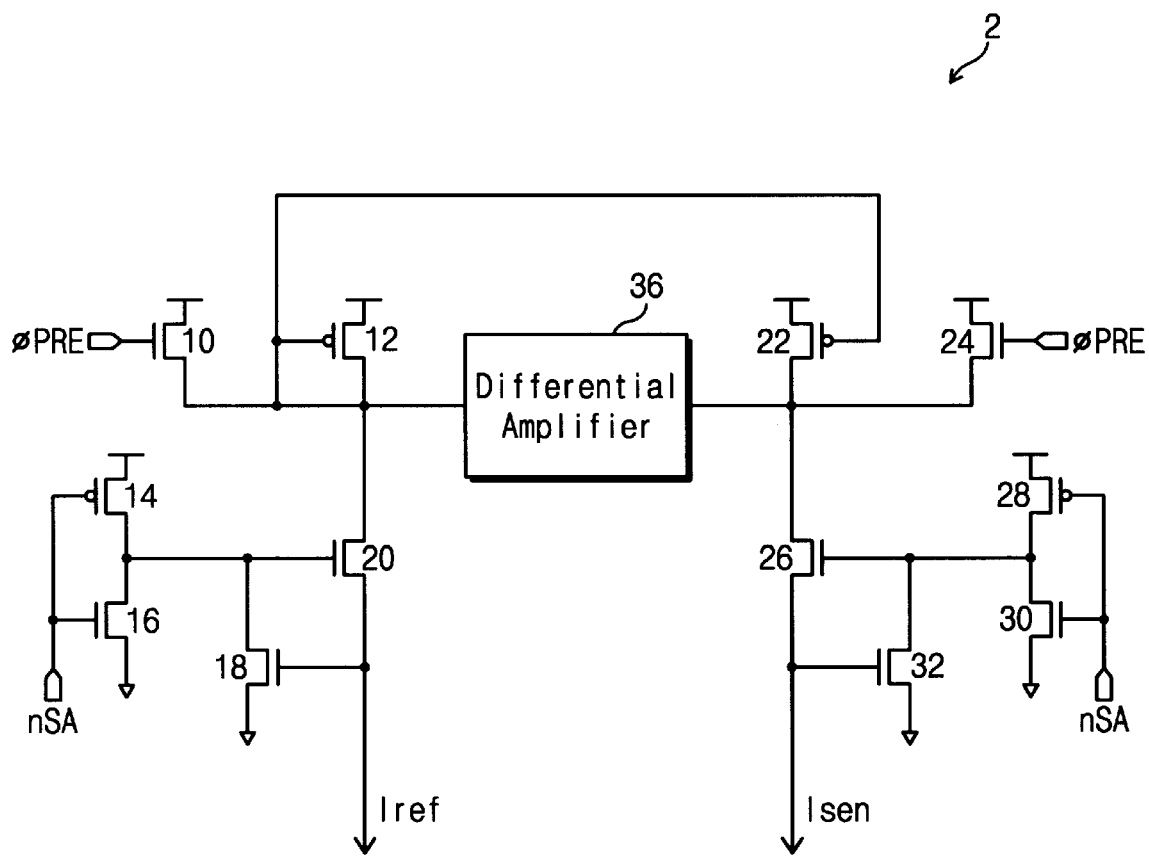
FIG. 2 is a circuit diagram of a conventional sense amplifier.
Figure 3:
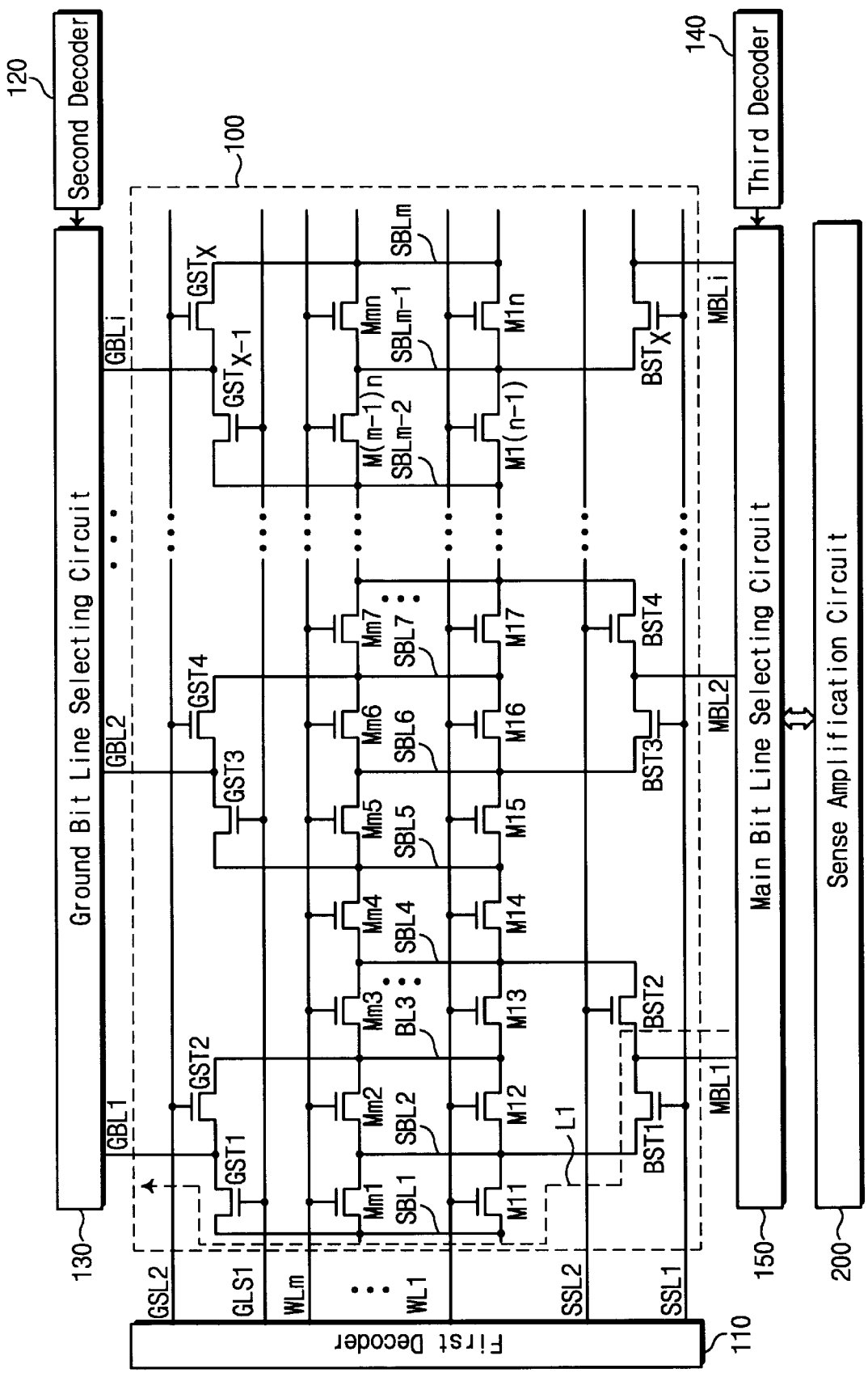
FIG. 3 is a block diagram of a NOR-structured mask ROM according to the present invention.

According to the present invention, a semiconductor memory device is implemented with a read-only memory, in particular, a NOR-structured mask ROM. In FIG. 3, the constituent elements that are identical to those of FIG. 1 are labeled with the same reference numerals.

Referring to FIG. 3, the NOR-structured mask ROM comprises a memory cell array 100. In the cell array 100, a plurality of memory cells are connected in parallel between two adjacent sub bit lines (the memory cells constitute a bank). The memory cells of each bank are connected to corresponding word lines. For example, the memory cells M11 to Mm1 are connected in parallel to each other between two adjacent sub bit lines SBL1 and SBL2. The memory cells M11 to Mm1 are connected to corresponding word lines WL1 to WLm. Each memory cell M11-Mmn comprises a metal-oxide-semiconductor field effect transistor (MOSFET) having a source, a drain and a gate.

As illustrated in FIG. 3, an even-numbered sub bit line SBL2 is connected to a main bit line MBL1 through an NMOS transistor BST1. NMOS transistor BST1 selects a bank responsive to a select signal SSL1. An even-numbered sub bit line SBL4 is connected to the main bit line MBL1 through an NMOS transistor BST2. NMOS transistor BST2 selects a bank responsive to a select signal SSL2. The remaining even-numbered sub bit lines SBL6, SBL8, . . . , SBLj are likewise connected to corresponding main bit lines MBL3, MBL4, . . . , MBLi.

An odd-numbered sub bit line SBL1 is connected to a ground bit line GBL1 through an NMOS transistor GST1. NMOS transistor GST1 selects a ground connection responsive to a select signal GSL1. An odd-numbered sub bit line SBL3 is connected to the ground bit line GBL1 through an NMOS transistor GST2. NMOS transistor GST2 selects a ground connection responsive to a select signal GSL2. Other odd-numbered sub bit lines SBL5, SBL7, . . . , and SBLj-1 are likewise connected to corresponding ground bit lines GBL3, GBL4, . . . , GBLi-1.

A first decoder circuit (or a row selection circuit) 110 is connected to the word lines WL1-WLm and the select signal lines SSL1, SSL2, GSL1, and GSL2. During a data reading operation, the first decoder circuit 110 selects and drives one of the word lines WL1-WLm. At the same time, the first decoder circuit 110 selects and drives one of the select signal lines SSL1 and SSL2 for a main bit line selection. Similarly, the first decoder circuit 110 selects and drives one of the select signal lines GSL1 and GSL2 for a ground bit line selection.

Figure 4:
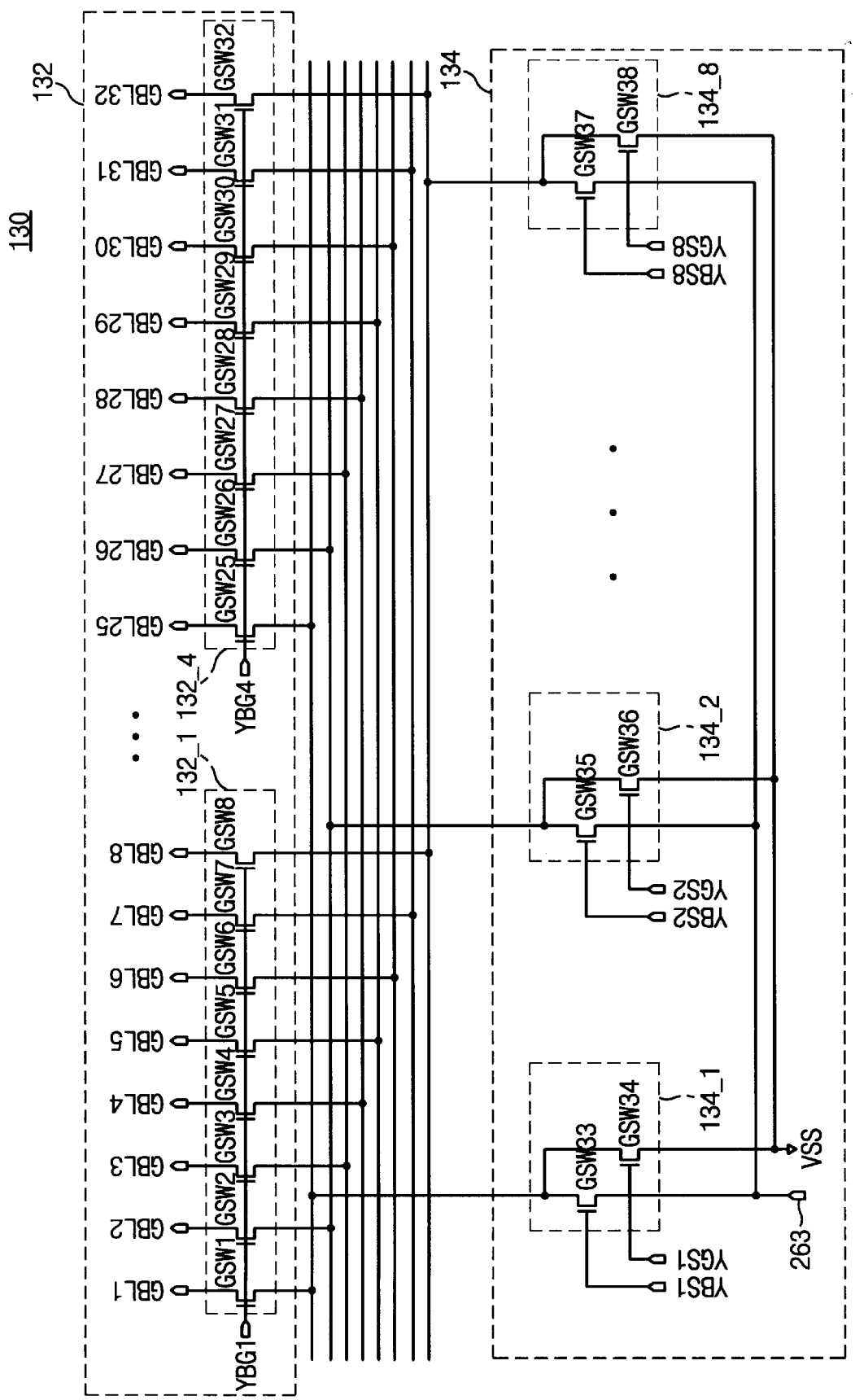
FIG. 4 is a schematic diagram of the ground bit line selecting circuit shown in FIG. 3.

A ground bit line selecting circuit 130 is coupled to the The ground bit lines GBL1-GBLi. The ground bit line selecting circuit 130 selects a ground bit line to be coupled to a selected memory cell according to the control of a second decoder circuit 120. The ground bit line selecting circuit 130 biases another ground bit line arranged at a right side of the selected ground bit line. The ground bit line selecting circuit 130 grounds all other ground bit lines. A preferred embodiment of the ground bit line selecting circuit 130 is illustrated in FIG. 4. For simplicity, 32 ground bit lines GBL1–GBL32 are shown in FIG. 4 wherein the 32 ground bit lines GBL1–GBL32 are divided into four groups each having eight ground bit lines.

The ground bit line selecting circuit 130 comprises first and second column pass gate circuits 132 and 134, respectively. The first column pass gate circuit 132 selects one group of the four groups of ground bit lines responsive to select signals YBG1–YBG4 from the second decoder circuit 120. The first column pass gate circuit 132 comprises first four switching sections 132_1–132_4 each corresponding to one of the four groups of ground bit lines. Each of the first switching sections 132_1–132_4 comprises eight NMOS transistors, each having a gate receiving a corresponding select signal YBGi (i=1–4) and a current channel formed between a corresponding ground bit line and the second column pass gate circuit 134.

The second column pass gate circuit 134 comprises second eight switching sections 134_1–134_8 each corresponding to one of the NMOS transistors of each section 132_1–132_4. The second column pass gate circuit 134 biases one of the ground bit lines corresponding to the first switching section 132_1 thus selected and grounds the others responsive to select signals YGSi and YBSi (i=1–8) generated by the second decoder circuit 120. The select signals YGSi are used for ground selection and the select signals YBSi are used for bias selection. Each of the second switching sections 134_1–134_8 has two NMOS transistors. An NMOS transistor GSW33 of the second switching section 134_1 has a gate coupled to the select signal YBS1, a drain commonly connected to each first NMOS transistor GSW1, GSW9, GSW17 and GSW25 of each section 132_1–132_4 in the first column pass gate circuit 132, and a source coupled to a node 263 for receiving a bias current or a bias voltage. The other NMOS transistor GSW34 of the second switching section 134_1 has a gate coupled to the select signal YGS1, a drain connected to the first NMOS transistors GSW1, GSW9, GSW17 and GSW25 or to the drain of the NMOS transistor GSW33, and a source coupled to a ground VSS. As illustrated in FIG. 4, the second switching sections 134_2–134_8 likewise have two NMOS transistors connected to corresponding NMOS transistors of each section 132_1–132_4.

The ground bit line selecting circuit 130 operates as follows. When a switching section 132_1 of the first column pass gate circuit 132 is selected during the data reading operation, a ground bit line GBL1 is grounded, the ground bit line GBL2 adjacent to the line GBL1 is biased, and the other ground bit lines GBL3–GBL8 are grounded. In particular, when the select signals YBG1, YBS2, YGS1 and YGS3–YGS8 are activated, the ground bit line GBL1 is grounded through the NMOS transistors GSW1 and GSW34 and the ground bit line GBL2 is coupled to the node 263 through the NMOS transistors GSW2 and GSW35. The other ground bit lines GBL3–GBL8 are grounded through corresponding NMOS transistors.

Figure 5:
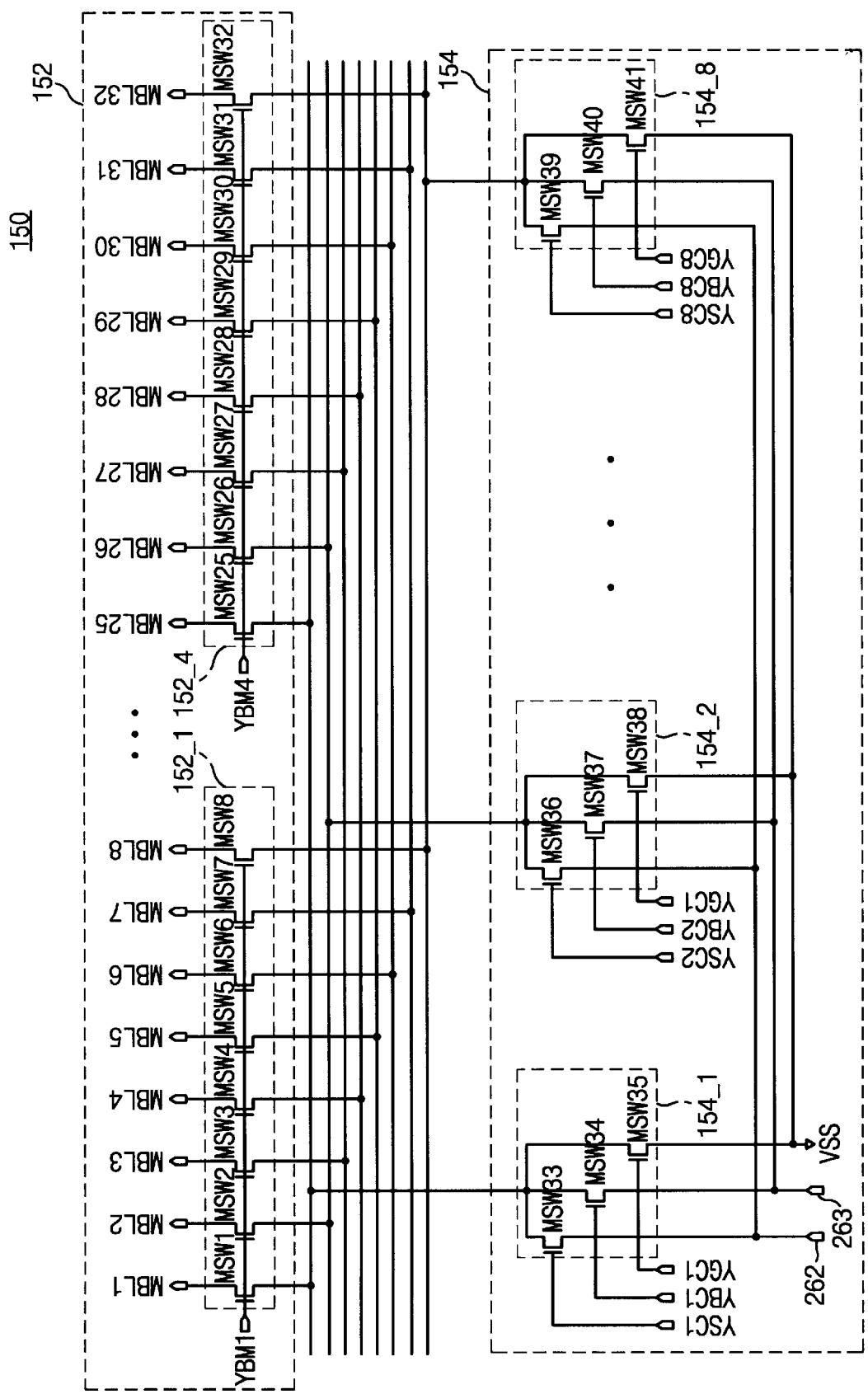
FIG. 5 is a schematic diagram of the main bit line selecting circuit shown FIG. 3.

Returning to FIG. 3, the NOR-structured mask ROM of the present invention further comprises a third decoder circuit 140 and a main bit line selecting circuit 150. The main bit lines MBL1-MBLi are connected to the third decoder circuit 140 and the main bit line selecting circuit 150. A preferred embodiment of the main bit line selecting circuit 150 is illustrated in FIG. 5. For simplicity, 32 main bit lines MBL1–MBL32 are shown in FIG. 4, wherein the 32 main bit lines MBL1–MBL32 are divided into four groups each having eight main bit lines.

In FIG. 5, the main bit line selecting circuit 150 comprises third and fourth column pass gate circuits 152 and 154, respectively. The third column pass gate circuit 152 comprises third switching sections 152_1–152_4. The third column pass gate circuit 152 selects one of the four switching sections 152_1–152_4 responsive to select signals YBM1–YBM4 from the third decoder circuit 140. Each of the third switching sections 152_1–152_4 has eight NMOS transistors. For example, when the select signal YBM1 is activated, eight main bit lines MBL1–MBL8 are coupled to the fourth column pass gate circuit 154 through the third switching section 152_1.

The fourth column pass gate circuit 154 comprises fourth switching sections 154_1–154_8, each of which has three NMOS transistors. In particular, the NMOS transistor MSW33 of the fourth switching section 154_1 has a gate coupled to the select signal YSC1 line, a source commonly coupled to each first NMOS transistor MSW1, . . . , MSW25 of each third switching section 152_1–152_4 of the third column pass gate circuit 152, and a drain coupled to a node 262 for receiving a sensing current or a sensing voltage. The NMOS transistor MSW34 of the fourth switching section 154_1 has a gate coupled to the select signal YBC1 line, a source coupled to the source of the NMOS transistor MSW33, and a drain coupled to a node 263 for receiving the bias current. The NMOS transistor MSW35 of the fourth switching section 154_1 has a gate coupled to the select signal line YBC1, a source commonly coupled to the source of each NMOS transistors MSW33 and MSW34, and a drain coupled to the ground VSS. As illustrated in FIG. 5, fourth switching sections 154_2–154_8 likewise have three NMOS transistors collectively connected to a corresponding NMOS transistor of each section 152_1–152_4. The select signals YSCi are used for a sensing current selection, the select signals YBCi are used for a bias current selection, and the select signals YGCi are used for a ground selection.

According to the main bit line selecting circuit 150 of the present invention, when one section 152_1 of the third column pass gate circuit 152 is selected during the data reading operation, a main bit line MBL1 is supplied with the sensing current or the sensing voltage, another main bit line MBL2 arranged at a right side of the selected is supplied with a bias current of the same amount as the sensing current, and the other main bit lines are grounded. In particular, when the signals YBM1, YSC1, YBC2 and YGC3–YGC8 are activated, the main bit line MBL1 is coupled to the node 262 through the NMOS transistors MSW1 and MSW33 and the main bit line MBL2 is coupled to the node 263 through NMOS transistors MSW2 and MSW37. The main bit lines MBL3–MBL32 are grounded through corresponding NMOS transistors.

Referring again to FIG. 3, the NOR-structured mask ROM further comprises a sense amplification circuit 200 for sensing and amplifying data information in the memory cell assigned by means of the ground and main bit line selecting circuits 130 and 150 and the first decoder circuit 110. The sense amplification circuit 200 provides the sensing current Isen and the bias current Ibias to the nodes 262 and 263 of the ground and main bit line selecting circuits 130 and 150 during the data reading operation.

Figure 6:
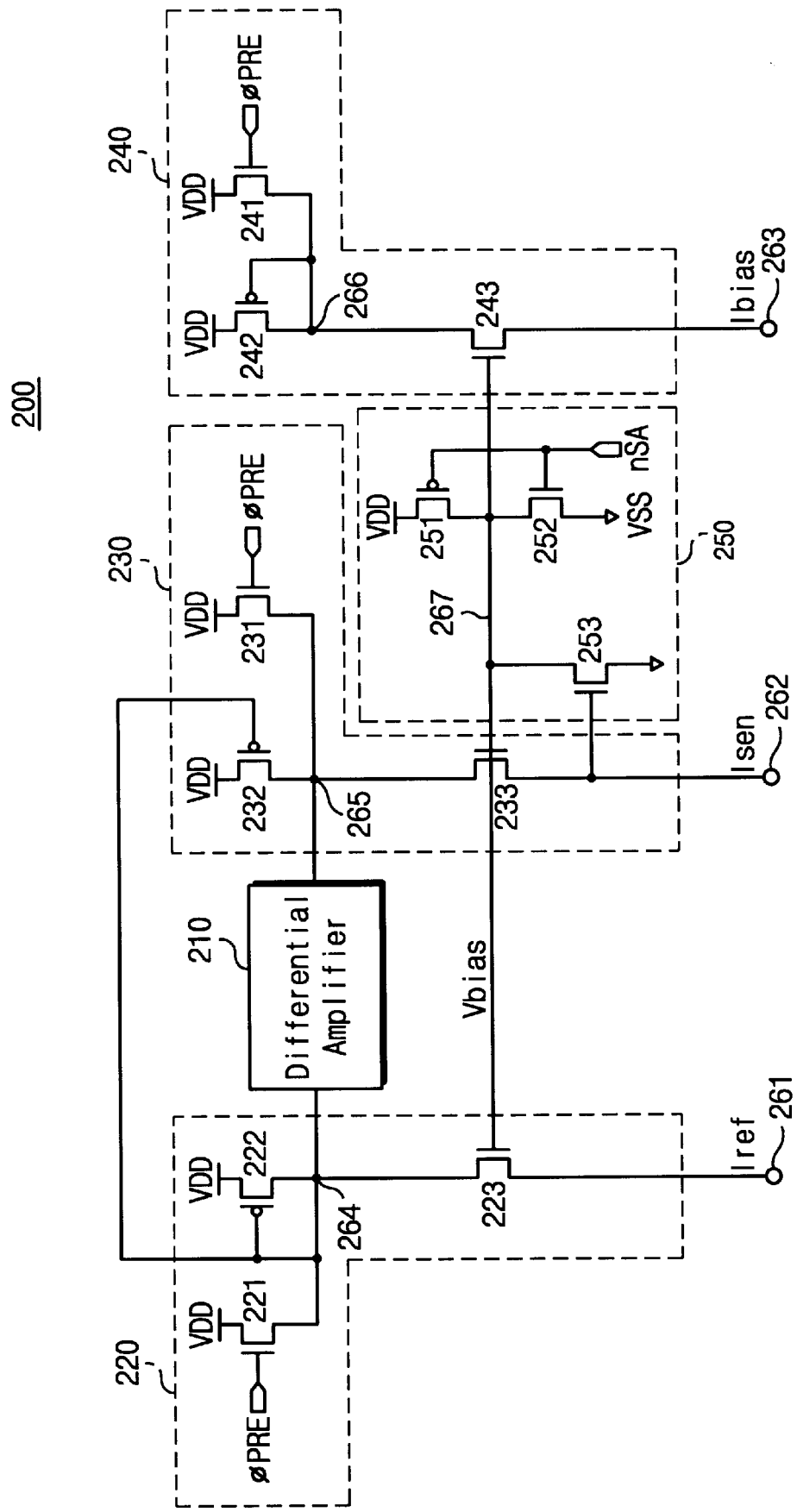
FIG. 6 is a schematic diagram of the sense amplification circuit shown in FIG. 3.

A preferred embodiment of the sense amplification circuit 200 according to the present invention is shown in FIG. 6. The sense amplification circuit 200 comprises a differential amplifier 210, a reference current sourcing section 220, a sensing current sourcing section 230, a bias current sourcing section 240, and a bias voltage generator 250. The sense amplification circuit 200 further comprises a node 261 which is coupled to a reference cell (refer to U.S. Pat. No. 5,856,748) that outputs a reference current Iref, a node 262 that outputs the sensing current Isen, and a node 263 that outputs the bias current Ibias. The reference current Iref may be set to about half the current that flows through the on-cell. However, it should the noted that a current that is two or more times larger than the reference current Iref may be used. The bias current Ibias may be set to have the same amount as the sensing current Isen.

The reference current sourcing section 220 is comprised of a PMOS transistor 222 and two NMOS transistors 221 and 223. The NMOS transistor 221 has a gate coupled to a precharge control signal φPRE and a current path formed between a power supply voltage VDD and a reference node 264. The reference node 264 is coupled to an input terminal of the differential amplifier 210. The PMOS transistor 222 has a gate coupled to the reference node 264 and a current path formed between the power supply voltage VDD and the reference node 264. The NMOS transistor 223 has a gate for receiving a bias voltage Vbias from the bias voltage generator 250 and a current path formed between the reference node 264 and the node 261.

The sensing current sourcing section 230 comprises a PMOS transistor 232 and two NMOS transistors 231 and 233. The NMOS transistor 231 has a gate coupled to the precharge control signal φPRE and a current path formed between the power supply voltage VDD and a sense node 265. The sense node 265 is coupled to the other input terminal of the differential amplifier 210. The PMOS transistor 232 has a gate coupled to the gate of the PMOS transistor 222 or to the reference node 264 and a current path formed between the power supply voltage VDD and the sense node 265. The NMOS transistor 233 has a gate for receiving the bias voltage Vbias and a current path formed between the reference node 265 and the node 262 to be coupled to the fourth column pass gate circuit 154.

The bias current sourcing section 240 comprises a PMOS transistor 242 and two NMOS transistors 241 and 243. The NMOS transistor 241 has a gate coupled to the precharge control signal φPRE and a current path formed between a power supply voltage VDD and a node 266. The PMOS transistor 242 has a gate coupled to the node 266 and a current path formed between the power supply voltage VDD and the node 266. The NMOS transistor 243 has a gate for receiving the bias voltage Vbias and a current path formed between the nodes 263 and 266.

The bias voltage generator 250 comprises a PMOS transistor 251 and two NMOS transistors 252 and 253. Current paths of the PMOS and NMOS transistors 251 and 252 are formed in series between the power supply voltage VDD and the ground VSS and their gates are commonly coupled to a sense amplifier control signal nSA. The NMOS transistor 253 has a gate coupled to the node 262 and a current path formed between the ground VSS and a node 267 both for transferring the bias voltage Vbias and coupled between the current paths of the transistors 251 and 252.

In this embodiment, only one bias current sourcing section 240 for sourcing the bias current Ibias to the main and ground bit lines is implemented in the sense amplification circuit 200. However, those skilled in the art should recognize that two or more bias current sourcing sections can be used to source the bias current Ibias to the ground bit line and to the main bit line independently of each other.

The sense amplification circuit 200 operates as follows. To read out data information from a memory cell M11, the first decoder circuit 110 of FIG. 1 selects the word line WL1, the select signal line SSL1, and the ground select signal line GSL1. Thereafter, the main and ground bit lines are selected as follows.

Referring to FIG. 4, when the select signals YBG1, YBS2, YGS1 and YGS3–YGS8 are activated, the ground bit line GBL1 is coupled to the ground VSS through the NMOS transistors GSW1 and GSW34 of the ground bit line selecting circuit 130. Additionally, the ground bit line GBL2 is coupled to the node 263 for receiving the bias current Ibias through the NMOS transistors GSW2 and GSW35. At this time, the other ground bit lines GBL3–GBL8 are grounded through corresponding NMOS transistors. For example, a ground bit line GBL8 is coupled to the ground VSS through the NMOS transistors GSW8 and GSW38.

When the select signals YBM1, YSC1, YBC2, and YGC3–YGC8 are activated (FIG. 5), the main bit line MBL1 is coupled to the node 262 through the NMOS transistors MSW1 and MSW33 of the main bit line selecting circuit 150. Additionally, the main bit line MBL2 is coupled to the node 263 through NMOS transistors MSW2 and MSW37 thereof. The other main bit lines MBL3–MBL32 are grounded through corresponding NMOS transistors. For example, a main bit line is coupled to the ground VSS through the NMOS transistors MSW8 and MSW41.

Referring to FIG. 6, when the sense amplifier control signal nSA transitions from a logic high level to a logic low level, the PMOS transistor 251 of the bias voltage generator 250 is turned on and the NMOS transistor 252 thereof is turned off. This causes the voltage of the line 267 to increase to a high level. The precharge control signal φpPRE transitions from a logic low level to a logic high level simultaneously with the high to low transition of the sense amplifier control signal nSA. This activates the NMOS transistor 221 of the reference current sourcing section 220, the NMOS transistor 231 of the sensing current sourcing section 230, and the NMOS transistor 241 of the bias current sourcing section 240, thus causing the voltages at each node 264, 265, and 266 to rise.

When the voltage on nodes and 265 increase, current flows from the node 265 to the node 262 by activation of the NMOS transistor 233 thereby causing the voltage at node 262 to increase. The increase in the voltage at node 262 causes the voltage at the gate of the NMOS transistor 253 to rise. The voltage at node 267 is then fixed at a level at which the current supply capability of the PMOS transistor 251 is balanced with the current discharge capability of the NMOS transistor 253.

After the voltage at node 267 is stabilized at a fixed level, i.e., the bias voltage Vbias, the precharge control signal φPRE is deactivated, i.e., transitions from a logic high level to a logic low level. The NMOS transistors 221, 231 and 241 stops supply current to the corresponding nodes 264, 265, and 266. At this time, the PMOS transistors 222, 232, and 242 supply current to the nodes 264, 265, and 266. Since current is discharged from the node 264 by a reference cell (not shown) in this state, the voltage at the node 264 is determined by the difference between the amount of current supplied by the PMOS transistor 222 and the amount of current discharged by the reference cell (not shown).

Under these conditions, the sensing current Isen from the sensing current sourcing section 230 is supplied to the main bit line MBL1, which is coupled to the selected memory cell M11, through the main bit line selecting circuit 150. The bias current Ibias from the bias current sourcing section 240 is supplied to the main bit line MBL2. The bias current Ibias is also supplied to the ground bit line GBL2 arranged at the right side of the ground bit line GBL1 grounded.

When the selected memory cell M11 is an on-cell, the sensing current Isen supplied to the main bit line MBL1 is discharged through the NMOS transistor BST1, the memory cell M11, the sub bit line SBL1, the NMOS transistor GST1, and the ground bit line GBL1 grounded. Thereafter, the voltage at the sensing node 265 of the sensing current sourcing section 230 is determined by the difference between the amount of current supplied by the PMOS transistor 232 and the amount of current discharged by a selected memory cell M11. That is, the sense amplification circuit 200 senses the selected memory cell M11 as an on-cell.

When the selected memory cell M11 is an off-cell, the sensing current Isen is charged on the main bit line MBL1, so that the voltage of the main bit line MBL1 increases. Since the bias current Ibias is supplied both on the main bit line MBL2 and on the ground bit line GBL2 the main bit line MBL2 and the ground bit line GBL2 are set at the same voltage as the main bit line MBL 1. This arrangement results in no source-drain voltage Vds difference in the memory cells (MOSFETs) M12, M13, M14 and M15 that are coupled to the selected word line WL1 and the NMOS transistor GST3 that is coupled to the selected signal line GSL1. Thus, the leakage current paths to the main bit line MBL2 and to the ground bit line GBL2 are cut off. As a result, the voltage at the sensing node 265 of the sensing current sourcing section 230 is rapidly and accurately determined by the difference between the amount of current supplied by the PMOS transistor 232 and the amount of current discharged by a selected memory cell M11. That is, the sense amplification circuit 200 senses the selected memory cell M11 as an off-cell.

In accordance with the present invention set forth above, the ground and main bit line selecting circuits 130 and 150 and the sense amplification circuit 200 are configured such that only one main bit line MBL2 is charged by the bias current Ibias having the same amount as the sensing current Isen and only one ground bit line GBL2 is charged by the bias current Ibias. This cuts off leakage current paths to the biased main and ground bit lines. The main bit line MBL2 and the ground bit line GBL2 can be charged by means of only one sense amplification circuit 200. The charge/discharge time for charging and discharging the main and ground bit lines MBL2 and GBL2 is reduced making realization of a high-speed mask ROM having the NOR structure possible. Since only two bit lines MBL2 and GBL2 are charged, power consumption is reduced and no power noise is generated.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A read-only memory device having a NOR structure, comprising:
   a memory cell array having a plurality of memory cells, each memory cell storing data;
   a plurality of first bit lines coupled to the array;
   a plurality of second bit lines coupled to the array;
   first selection means coupled to the plurality of first bit lines for selecting at least two adjacent first bit lines;
   second selection means coupled to the plurality of second bit lines for selecting at least two adjacent second bit lines; and
   sense amplification means for detecting a cell state of a selected memory cell by biasing the selected first bit lines and one of the selected second bit lines with a same potential;
   wherein the second selection means grounds another of the selected second bit lines.

2. The read-only memory device of claim 1 wherein the first selection means grounds unselected first bit lines and wherein the second selection means grounds unselected second bit lines.

3. The read-only memory device according of claim 2 wherein the plurality of first bit lines are divided into a plurality of bit line groups and wherein the first selection means comprises:
   a first decoding circuit for generating a plurality of first and second selection signals;
   a first column pass gate circuit for selecting a group of first bit lines responsive to a first selection signal; and
   a second column pass gate circuit for providing a sensing current to a selected first bit line and a bias current to another selected first bit line.

4. The read-only memory device of claim 3 wherein the second column pass gate circuit grounds unselected first bit lines.

5. The read-only memory device of claim 4 wherein the first column pass gate circuit comprises a plurality of first switching sections, each first switching section coupled to a corresponding first selection signal and a first bit line.

6. The read-only memory device of claim 5 wherein each first switching section is a NMOS transistor having a current path formed between the corresponding first bit line and the second column pass gate circuit and a gate for receiving the corresponding first selection signal.

7. The read-only memory device of claim 5 wherein the second selection signals are divided into sensing current selection signals, bias current selection signals, and ground selection signals and wherein the second column pass gate circuit comprises a plurality of second switching sections, each second switching section comprising a plurality of transistors.

8. The read-only memory device of claim 7 wherein each second switching section comprises a plurality of NMOS transistors responsive to a sensing current selection signal, bias current selection signal, and a ground selection signal.

9. The read-only memory device of claim 8 wherein the sense amplification means comprises:
   a bias voltage generating circuit for generating a bias voltage;
   a reference current sourcing section having a reference node for sourcing a reference current in accordance with the bias voltage;
   a sense current sourcing circuit having a sense node for sourcing the sensing current in accordance with the bias voltage;

a bias current sourcing circuit for sourcing the bias current in accordance with the bias voltage; and a differential amplifier for comparing a voltage difference between the reference and sense nodes.

10. The read-only memory of claim 9 wherein the plurality of second bit lines are divided into a plurality of second bit line groups, each second bit line corresponding to a first bit line, and wherein the second selection means comprises:

a second decoding circuit for generating a plurality of third and fourth selection signals;

a third column pass gate circuit for selecting a group of second bit lines responsive to a third selection signal; and a fourth column pass gate circuit for providing the bias current to a selected second bit line and grounding all other selected second bit lines.

11. The read-only memory device of claim of 10 wherein the third column pass gate circuit comprises a plurality of third switching sections, each third switching section coupled to a corresponding third selection signal and a second bit line.

12. The read-only memory device of claim 11 wherein each third switching section is a NMOS transistor having a current path formed between the corresponding second bit line and the fourth column pass gate circuit and a gate for receiving the corresponding third selection signal.

13. The read-only memory device of claim 11 wherein the fourth selection signals are divided into second bias selection signals and second ground selection signals and wherein the fourth pass gate circuit comprises a plurality of fourth switching sections, each fourth switching section comprising a plurality of transistors.

14. The read-only memory device of claim 13 wherein each fourth switching section comprises at least two NMOS transistors responsive to corresponding bias current selection signals and corresponding ground selection signals.

15. The read-only memory device of claim 14 wherein one of the at least two NMOS transistors has a gate for receiving the corresponding bias current and a current path formed between a corresponding third switching section and a third node, the third node for receiving the bias current and wherein the other of the at least two NMOS transistors has a gate for receiving the corresponding the corresponding ground selection signal and a current path formed between a corresponding third switching section and a ground.

16. The read-only memory device of claim 7 wherein each second switching section comprises a first, a second, and a third NMOS transistors, the first NMOS transistor having a gate for receiving a corresponding sensing current selection signal and a current path formed between a corresponding first switching section and a first node for receiving a sensing current, the second NMOS transistor having a gate for receiving a corresponding bias current selection signal and a current path formed between a corresponding first switching section and a second node for receiving a bias current, and the third NMOS transistor having a gate for receiving a corresponding ground selection signal and a current path formed between a corresponding first switching section and a ground.

17. A semiconductor memory device, comprising:

a memory cell array including a plurality of memory cells for storing data;

a plurality of main and ground bit lines coupled to the array;

a main bit line selecting circuit coupled to the main bit lines for selecting a group of main bit lines;

a ground bit line selecting circuit for selecting a group of ground bit lines; and a sense amplification circuit for biasing the selected first bit lines and one of the selected ground bit lines with a same potential.

18. The semiconductor memory device of claim 17 wherein the selected group of main bit lines are two adjacent main bit lines and wherein the selected group of ground bit lines are two adjacent ground bit lines.

19. The semiconductor memory device of claim 17 wherein the ground bit line selecting circuit grounds unselected ground bit lines and wherein the main bit lines selecting circuit ground unselected main bit lines.

20. The semiconductor memory device of claim 17 wherein the main bit line selecting circuit comprises:

a first column pass gate circuit including a plurality of first switching sections, each first switching section being responsive to a first selection signal; and a second column pass gate circuit including a plurality of second switching sections, each second switching section providing the first column pass gate circuit with a sensing current, a bias current, and a ground responsive to corresponding sensing current, bias current, and ground selection signals, respectively.

21. The semiconductor memory device of claim 20 wherein each first switching section comprises a plurality of NMOS transistors having commonly connected gates for receiving the corresponding first selection signal, each NMOS transistor having a channel formed between a corresponding main bit line and the second column pass gate circuit.

22. The semiconductor memory device of claim 20 wherein the sense amplification circuit comprises:

a bias voltage generating circuit for generating a bias voltage;

a reference current generating circuit having a reference node for generating a reference current responsive to the bias voltage;

a sensing current generating circuit having a sense node for generating the sensing current responsive to the bias voltage;

a bias current generating circuit for generating the bias current responsive to the bias voltage; and a differential amplifier coupled to the reference, sensing, and bias current generating circuits and to the bias voltage generating circuit for comparing a voltage between the reference and sense nodes.

23. The semiconductor memory device of claim 17 wherein the ground bit line selecting circuit comprises:

a first column pass gate circuit including a plurality of first switching sections, each first switching section being responsive to a first selection signal; and a second column pass gate circuit including a plurality of second switching sections, each second switching section providing the first column pass gate circuit with a bias current and a ground responsive to corresponding bias current and ground selection signals, respectively.

24. The semiconductor memory device of claim 23 wherein each first switching section comprises a plurality of NMOS transistors having commonly connected gates for receiving the corresponding first selection signal, each NMOS transistor having a channel formed between a corresponding ground bit line and the second column pass gate circuit.

* * * * *

UNITED STATES PATENT AND TRADEMARK OFFICE
CERTIFICATE OF CORRECTION

PATENT NO. : 6,088,277
DATED : July 11, 2000
INVENTOR(S) : Kim et al.

It is certified that error appears in the above-identified patent and that said Letters Patent is hereby corrected as shown below:

Column 8,
Line 47, "øpPRE" should read -- øPRE --.

Column 11,
Line 43, "the corresponding the corresponding" should read -- the corresponding --.

Signed and Sealed this

Second Day of April, 2002

*Attest:*

*Attesting Officer*

JAMES E. ROGAN
*Director of the United States Patent and Trademark Office*